United States Patent [19]

Galasso et al.

[11] 4,373,006
[45] Feb. 8, 1983

[54] SILICON CARBIDE COATED CARBON FIBERS AND COMPOSITES

[75] Inventors: Francis S. Galasso, Manchester; Richard D. Veltri, East Hartford, both of Conn.

[73] Assignee: United Technologies Corporation, Hartford, Conn.

[21] Appl. No.: 215,203

[22] Filed: Dec. 10, 1980

Related U.S. Application Data

[63] Continuation of Ser. No. 65,296, Aug. 9, 1979, abandoned.

[51] Int. Cl.³ .................. B32B 9/00; D02G 3/00
[52] U.S. Cl. ................... 428/368; 427/228; 427/249; 428/373; 428/375; 428/902
[58] Field of Search ............ 428/367, 368, 902, 446, 428/387, 384, 373, 375, 408; 427/397.7, 249, 228

[56] References Cited

U.S. PATENT DOCUMENTS

| | | | |
|---|---|---|---|
| 3,811,920 | 5/1974 | Galasso et al. | 428/368 |
| 3,811,927 | 5/1974 | Joo et al. | 428/367 |
| 3,955,038 | 5/1976 | Lindstrom | 427/249 |
| 4,018,631 | 4/1977 | Hale | 427/249 |
| 4,029,844 | 6/1977 | Olcott | 428/367 |
| 4,068,037 | 1/1978 | Debolt et al. | 427/249 |
| 4,131,697 | 12/1978 | Rundon et al. | 427/249 |

*Primary Examiner*—Stanley S. Silverman
*Attorney, Agent, or Firm*—Charles E. Sohl

[57] ABSTRACT

Silicon carbide coated carbon fibers and composite materials incorporating these fibers are disclosed. The silicon carbide coating provides electrical insulation and improved resistance to environmental degradation. The coated fibers may be embedded in organic, metal or glass matrices to form useful composite materials.

1 Claim, No Drawings

SILICON CARBIDE COATED CARBON FIBERS AND COMPOSITES

This is a continuation of application Ser. No. 65,296, filed on Aug. 9, 1979, now abandoned.

BACKGROUND OF THE INVENTION

1. Field of the Invention

This invention relates to the field of coated carbon fibers and to the field of carbon fiber composite materials.

2. Description of the Prior Art

It is now known that fibers produced from certain materials may have exceptional mechanical properties, properties which are many times greater than those of the same material produced in bulk form. Because of their form, however, such fibers have limited utility. To increase the utility, it is known to combine many such fibers in a suitable matrix material to form a composite material having a good overall combination of properties. Such a composite material is typlified by the material commonly known as fiberglass which consists of glass fibers in an organic resin matrix. Among the fibers which have been used in composites are glass fibers, boron fibers, ceramic fibers, metal fibers and carbon fibers. An overview of the fiber composite area is presented in the book entitled "High Modulus Fibers and Composites" by F. S. Galasso, published by Gordon and Breach, Science Publishers, Inc., New York, N.Y., 1969.

Carbon fibers have received a great deal of attention since they have a low density and high modulus. Such fibers are typically produced by heating an organic precursor fiber at a high temperature to first carbonize the fiber and then graphitize the carbonized fiber. Commercial carbon fibers have diameters of 5–10 microns and can be quite long; e.g., 10 feet or more. Such carbon fibers can be used in conjunction with a wide variety of organic matrices to produce composite materials. The specific details of the carbon fiber preparation and matrix material do not form a part of the present invention. Rather the invention is directed at a method for increasing the electrical resistance of the carbon fibers and their resistance to oxidation and corrosion so that when the fibers are incorporated in an organic matrix they will have high stability; and in the event of a fire and subsequent release into the air will not cause electrical short circuits.

It has been known in the prior art to form silicon carbide on various substrates by chemical vapor deposition. Silicon carbide filaments have been produced by using heated filaments as a substrate. Since the intent is to produce a high strength filament of silicon carbide, the precursor filaments are of small diameter relative to the finished filament diameter; e.g., 10%.

Limited work has been done using carbon fibers as a starting filament. For example, the article "Elevated Temperature Strength of Silicon Carbide on Carbon Filaments" by K. D. McHenry and R. E. Tressler in J. of Composite Materials V9 (January 1975) pp. 73–76 describes filaments formed on a starting carbon fiber of 0.001 in diameter. On this was deposited a pyrolytic graphite layer about 0.0001 thick, followed by silicon carbide. The resultant fiber was 0.004 inches in diameter. In this situation, the carbon core constituted about 7.5% of the final fiber area with silicon carbide making up the balance.

Similar work is described in "Improvement of Manufacturing Methods for the Production of Low Cost Silicon Carbide Filament" by H. DeBolt and V. Krokonis, AFML-TR-73-140 December 1972. This report is incorporated herein by reference for its teachings relating to specific methods of silicon carbide deposition.

SiC coated carbon fibers may also be advantageously combined with metal matrices. The SiC surface is more resistant to attack by molten metal than is the uncoated carbon surface.

SUMMARY OF THE INVENTION

Carbon fibers are provided with a thin adherent coating of silicon within certain thickness ranges. The silicon carbide comprises less than 50% of the cross section of the fiber. The silicon carbide coating adheres strongly to the carbon fibers and imparts a lower electrical conductivity to the carbon fiber. The silicon carbide layer may be oxidized to form a layer of silica for further benefits. The silicon carbide also has a high resistance to oxidation and other high temperature surface attacks. These fibers may be incorporated in a variety of matrices to produce improved composite materials which, in the event of fire or other catastrophic failures, will not release electricaly conductive fibers which potentially can interfere with electrical circuitry. Methods for producing the silicon carbide coating by a gas phase deposition process are described.

The foregoing and other objects, features and advantages of the present invention will become more apparent in light of the following detailed description of the preferred embodiments.

DESCRIPTION OF THE PREFERRED EMBODIMENTS

Chemical vapor deposition of silicon carbide is known in the prior art. AFML-TR-73-140 previously described is typical of such prior art.

This reference describes the production of silicon carbide by the decomposition of various silanes including $Me_2SiCl_2$ and $MeHSiCl_2$ where "Me" is the methyl radical.

For purposes of the invention, $MeHSiCl_2$ (methyldichlorosilane) is the preferred precursor.

The silane can be reacted with $CH_4$ and $H_2$ on the hot substrate surface to produce a thin, continuous silicon carbide coating.

This process may readily be used to apply silicon carbide to carbon fibers. Carbon fibers vary in their properties according to the method of production. It does not appear that the method of production or the nature of the carbon fiber has significant effect on the suitability of the fiber for the deposition of silicon carbide.

Typically, fibers are provided in the form of a yarn which consists of a large number of fibers loosely bundled together. It is a surprising feature of this invention that even when upwards of 10,000 fibers are bundled together to form a strand of yarn the chemical vapor deposition of silicon carbide produces an essentially uniform coating of silicon carbide over the surface of each fiber even on those fibers at the center of the yarn and even on those areas of fibers which are in close proximity to one another. It is also unusual that "bridging" of closely spaced fibers by the silicon carbide does not occur to any significant extent.

One limitation which must be placed on the silicon carbide layer is that its thickness must be limited so that the silicon carbide does not entirely fill the interfiber areas in the yarn. That is to say the silicon carbide must coat the individual fibers without bonding the fibers together. The strength of the composite depends in part upon maximum bond area between each fiber and the matrix. This result is achieved if the coating thickness is limited to less than about 1 micron. Since the fiber is envisioned as being primarily carbon, the silicon carbide thickness should be limited so that it constitutes less than 50% of the cross sections of the finished fiber.

A primary benefit of the invention is that the silicon carbide coating provides increased resistance to the flow of electricity to the carbon fiber. A 0.1 micron thick silicon carbide coating increased carbon yarn resistance from about 5 ohms to about 1,000 ohms. The magnitude of this increase is surprising in view of the fact that silicon carbide is a semiconductor rather than a good insulator.

In the absence of such an insulating coating, carbon fibers are sufficiently conductive to cause short circuits in electrical equipment. This problem has been of sufficient importance that the desirability in incorporating carbon fiber organic composite material in aircraft has been questioned, since in the event of a minor fire the fibers released by the fire might incapacitate the electrical system.

It has also been suggested that the small size and low density of the fibers would result in the fibers remaining airborne for a long period of time thus posing hazards in industrial plants and other similar situations.

It has been determined that sufficient insulating properties to prevent arcing in 110 V circuits can be obtained with little as 0.1 microns thickness of silicon carbide and for lower voltage circuits thinner coatings can be used. The broad range for the coating thickness of silicon carbide is 0.05 to 1 microns. It is further preferred that the carbon fiber cross-sectional area be equal to or greater than the silicon carbide cross-sectional area in the finished fiber.

Carbon fibers sold under the trade name HTS by Hercules and having an average diameter of $8\mu$ were coated with silicon carbide by holding the fibers in a chamber through which a mixture of 31 cc/min methyldichlorosilane, 110 cc/min of $CH_4$, and 96 cc/min of $H_2$ were passed. The fibers were maintained at a temperature of between 1100° and 1200° C. by passing them through an R.F. heated graphite susceptor. Under these conditions, reaction times of from 5 to 30 minutes produced silicon carbide coating thickness in the range of about 0.1 microns to 4 microns. The fibers thus coated were evaluated by placing the fibers on metal contacts spaced 2 inches apart having an applied voltage of 110 volts AC. The coated fibers displayed no significant electrical activity. An uncoated fiber underwent instantaneous catastrophic burning in this test.

Similar coating results can be obtained in a continuous process in which the carbon fiber or yarn to be coated would be drawn slowly through a reaction chamber.

Improved electrical resistance can be obtained by oxidizing the silicon carbide surface to convert it to $SiO_2$. Typical oxidation conditions would be 500°–600° C. in air for about 1 hour. These oxidized fibers may also be beneficial for use in certain matrix materials such as organics and glasses.

Silicon carbide coated carbon fibers can be incorporated in organic matrices, metal matrices and glass matrices. The use of silicon carbide coated carbon fibers in organic matrices will obviate concerns about the release of electrically conductive carbon fibers in the event of fire. Typical organic matrices are those in the classes known as epoxies and polyimides. Representative epoxy materials are those sold by the Minnesota Mining and Manufacturing Corp. under the designations PR-286 and PR-288 and that sold by Hercules, Inc. under the designation 3501. A representative polyimide is one sold by Hercules, Inc. under the designation 3004.

The use of silicon carbide coated carbon fibers in metal matrices offers another benefit. Metals such as Al, Mg and Ti can attack carbon fibers. This can adversely affect the properties of the resultant composite. A silicon carbide surface is resistant to attack by these metals and their alloys; and therefore, providing a continuous silicon carbide coating on carbon fibers can improve their integrity during and after infiltration of the metal matrix.

The fibers of the present invention are also suited for incorporation into glass matrix composites. Exemplary glass matrix materials are sold by the Corning Glass Works under the names of fused silica (7940), Pyrex (7740) and Vycor (7930). Fused silica is substantially 100% silica. Pyrex is a lower melting glass containing nominally 82% silica, 12% $B_2O_3$, 4% $Na_2O$, and 2% Al. Vycor contains nominally 96% silica and 3% $B_2O_3$.

Although this invention has been shown and described with respect to a preferred embodiment thereof, it should be understood by those skilled in the art that various changes and omissions in the form and detail thereof may be made therein without departing from the spirit and scope of the invention.

Having thus described a typical embodiment of our invention, that which we claim as new and desire to secure by Letters Patent of the United States is:

1. An electrically nonconductive fiber which comprises: a carbon fiber having a thin adherent coating consisting of silicon carbide thereon, said silicon carbide coating having a thickness of from about 0.05 to about 1 micron, said silicon carbide coating comprising less than 50% of the cross section of the coated fiber, said silicon carbide layer having on its surface a layer of silicon dioxide for enhanced electrical resistance.

* * * * *